(12) United States Patent
Zhan et al.

(10) Patent No.: US 10,727,221 B2
(45) Date of Patent: Jul. 28, 2020

(54) ESD PROTECTION DEVICE, SEMICONDUCTOR DEVICE THAT INCLUDES AN ESD PROTECTION DEVICE, AND METHOD OF MANUFACTURING SAME

(71) Applicant: NXP USA, Inc., Austin, TX (US)

(72) Inventors: Rouying Zhan, Chandler, AZ (US); Jean-Philippe Laine, saint lys (FR); Evgueniy Nikolov Stefanov, Vieille Toulouse (FR); Alain Salles, Ramonville Saint Agne (FR); Patrice Besse, Tournefeuille (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/287,031

(22) Filed: Feb. 27, 2019

(65) Prior Publication Data

US 2019/0312026 A1 Oct. 10, 2019

(30) Foreign Application Priority Data

Apr. 9, 2018 (EP) ..................................... 18305413

(51) Int. Cl.
*H01L 23/552* (2006.01)
*H01L 27/02* (2006.01)
*H01L 29/74* (2006.01)
*H02H 9/04* (2006.01)

(52) U.S. Cl.
CPC ...... *H01L 27/0262* (2013.01); *H01L 29/7428* (2013.01); *H02H 9/046* (2013.01)

(58) Field of Classification Search
CPC .................... H01L 27/0262; H01L 29/7424
USPC .......................................................... 257/660
See application file for complete search history.

(56) References Cited

U.S. PATENT DOCUMENTS

| 9,490,243 B2 | 11/2016 | Laine et al. |
| 9,543,420 B2 * | 1/2017 | Chen .................. H01L 29/6625 |
| 9,614,369 B2 * | 4/2017 | Laine ..................... H02H 9/046 |
| 9,620,495 B2 * | 4/2017 | Besse .................. H01L 29/7436 |
| 2014/0061716 A1 | 3/2014 | Zhan et al. |
| 2015/0221629 A1 | 8/2015 | Besse et al. |
| 2016/0285261 A1 | 9/2016 | Laine et al. |
| 2017/0125399 A1 | 5/2017 | Huang et al. |

FOREIGN PATENT DOCUMENTS

WO     2014041388 A1    3/2014

* cited by examiner

*Primary Examiner* — Luan C Thai

(57) ABSTRACT

An ESD protection device for protecting an integrated circuit against an ESD event includes a first terminal coupled to an input/output pad of the IC, a second terminal coupled to a reference or ground voltage, a silicon-controlled rectifier device having an anode connected to the first terminal and a cathode connected to the reference or ground voltage, and a pnp transistor coupled in parallel with the SCR device. The pnp transistor has an emitter coupled to the first terminal, a collector coupled to the second terminal, and a base coupled to a gate of the SCR. The pnp transistor includes a contact region formed at a first side of a substrate, the first contact region being surrounded by an STI layer formed at the first side of the substrate. An insulation structure is formed at an intersection of the first contact region and the STI layer.

17 Claims, 5 Drawing Sheets

US 10,727,221 B2

ESD PROTECTION DEVICE, SEMICONDUCTOR DEVICE THAT INCLUDES AN ESD PROTECTION DEVICE, AND METHOD OF MANUFACTURING SAME

TECHNICAL FIELD OF THE INVENTION

The present invention relates generally to electrostatic discharge (ESD) protection circuits which may be implemented on a semiconductor device. More specifically, the present invention relates to ESD protection circuits with enhanced robustness to ESD events.

BACKGROUND OF THE INVENTION

Electrostatic discharge (ESD) is a problem in the utilization, manufacturing, and/or design of semiconductor devices. An integrated circuit (IC) manufactured on a semiconductor device can be damaged when ESD events are received from other circuits coupled to the semiconductor device or from people and/or machinery and tools touching the semiconductor device. During an ESD event the IC may receive a charge which leads to relatively large currents during a relatively short period of time. As the result of the large current, the voltage inside the IC increases. If the resulting voltage, current, power or energy exceeds a maximum capability of the IC then it may create irreparable damage to the IC.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

Figure 1:
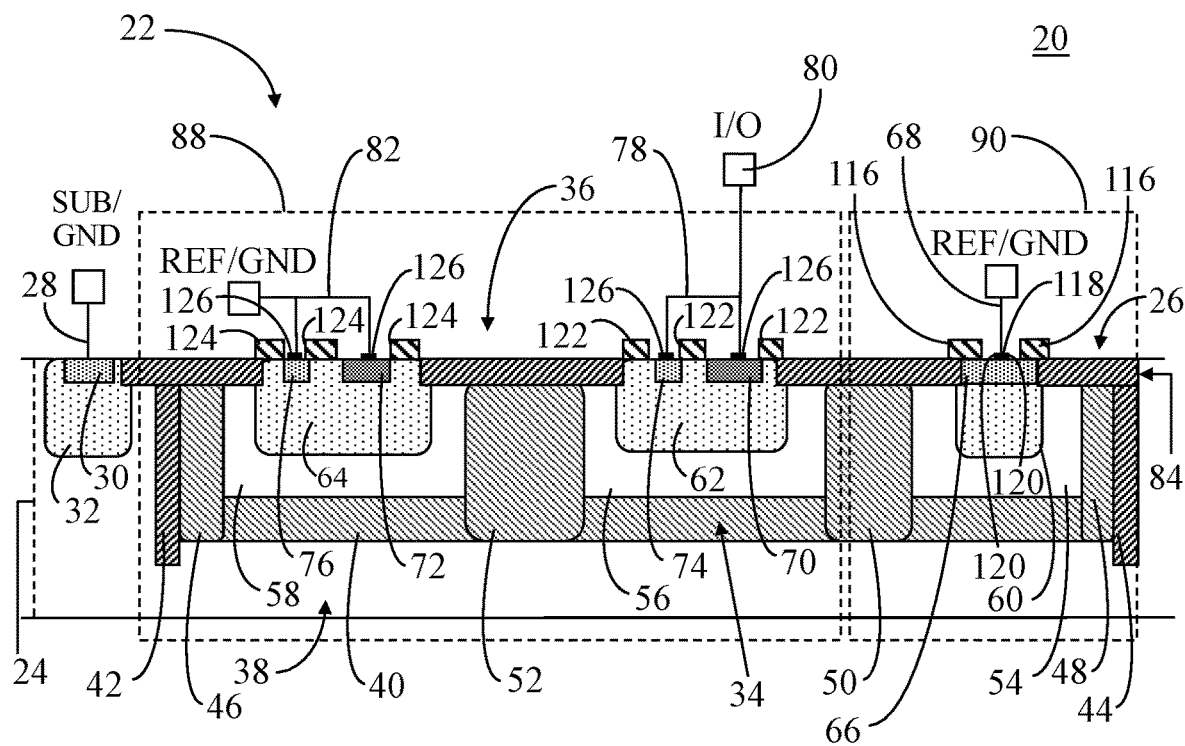
FIG. 1 shows, in a cross-sectional view, a structure of a semiconductor device which includes an ESD protection device in accordance with an embodiment.

In overview, the present disclosure concerns electrostatic discharge (ESD) protection devices, semiconductor devices that include ESD protection devices, and methodology for manufacturing a semiconductor device that includes an ESD protection device. More particularly, the ESD protection circuits are implemented as a pnp transistor combined with one or more bi-directional silicon-controlled rectifiers (SCRs). The pnp transistor is manufactured to include a suitably located insulation structure (e.g., resist protective oxide) that may improve the robustness of the ESD protection circuit to an ESD event in some embodiments. In some embodiments, the combined SCR/pnp transistor architecture is further formed such that an N-buried layer is located below the one or more SCRs, but the N-buried layer is absent below the pnp transistor to further improve the robustness of the ESD protection circuit to an ESD event. The pnp transistor may be incorporated in prior art combined SCR/pnp transistor architectures without requiring process changes and without increasing the footprint of the ESD circuit over prior art combined SCR/pnp transistor architectures.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Much of the inventive functionality and many of the inventive principles are best implemented with or in integrated circuits (ICs) including possibly application specific ICs or ICs with integrated processing or control or other structures. It is expected that one of ordinary skill, notwithstanding possibly significant effort and many design choices motivated by, for example, available time, current technology, and economic considerations, when guided by the concepts and principles disclosed herein will be readily capable of generating such ICs and structures with minimal experimentation. Therefore, in the interest of brevity and minimization of any risk of obscuring the principles and concepts according to the present invention, further discussion of such structures and ICs, if any, will be limited to the essentials with respect to the principles and concepts of the various embodiments.

Referring to FIG. 1, FIG. 1 shows, in a cross-sectional view, a structure of a semiconductor device 20 which includes an ESD protection device 22 in accordance with an embodiment. Only a cross-sectional view is presented herein. Those skilled in the art will recognize that the structure extends for some distance in a direction perpendicular to the plane of the figure. Further, as will be discussed hereinafter, some of the structures enclose a region, which means that they extend for some distance in the direction perpendicular to the plane of the figure and subsequently follow a path parallel to the plane of the figure.

ESD protection device 22 entails a combined SCR/pnp transistor architecture which can provide a compact size and a satisfactory protection margin in human body model (HBM) testing (e.g., simulating ESD due to discharge from human beings). Semiconductor devices that include ESD protection circuits, such as a combined SCR/pnp transistor architecture, should additionally pass system level testing to verify their resistance to tolerating perturbations (e.g., ESD events) that might otherwise damage the integrated circuits on the semiconductor devices. Testing semiconductor devices for ESD robustness can involve implementing an IEC 61000-4-2 system level standard released by the International Electrotechnical Commission (IEC) to support ESD compliance qualification. This standard defines the corresponding system level ESD pulse waveform parameters that should be delivered by the ESD tester, outlines the corresponding test methodologies, the pass/fail criteria, and so forth. It may be challenging for some prior art combined SCR/pnp transistor architectures to pass system level IEC 61000-4-2 gun-stress tests. In accordance with embodiments described below, ESD protection device 22 includes structural features that may enhance the ESD robustness of ESD protection device 22 relative to prior art designs.

With continued reference to FIG. 1, semiconductor device 20 comprises a p-doped substrate 24. P-doped substrate 24 has a first side 26. In some configurations, p-doped substrate 24 may also be subdivided in two layers. The bottom layer (seen in the orientation as presented in FIG. 1) is a p-doped semiconductor material on which a p-doped epitaxy layer has been manufactured. In this configuration, the p-doped semiconductor material should be comparable to the p-doped epitaxy layer. It is further to be noted that p-doped substrate 24 may be electrically brought into contact with a substrate voltage or a ground voltage via a substrate connection 28. In this example, substrate connection 28 is coupled to a substrate contact region 30 which is p-doped with a relatively high doping. Substrate contact region 30 extends from the first side for some distance into p-doped substrate 24 and is embedded in a (regular) p-doped region 32 which has a p-dopant concentration which is in between the p-dopant concentration of substrate contact region 30 and the p-dopant concentration of the p-doped substrate 24.

An isolation structure 34 is manufactured within p-doped substrate 24. Isolation structure 34 separates a first region 36 of p-doped substrate 24 from a second region 38 of p-doped substrate 24. First region 36 is generally enclosed by isolation structure 34. Isolation structure 34 includes, at least, an N-buried layer (NBL), 40 arranged inside p-doped substrate 24 at an interface between first and second regions 36, 38 of p-doped substrate 24. N-buried layer 40 is arranged in a lateral direction and is arranged, seen from first side 26 of p-doped substrate 24, below the interface between first region 36 and second region 38. Isolation structure 34 may additionally include a Deep Trench Isolation (DTI) structure 42, 44 which encloses first region 36. Still further, isolation structure 34 may include N-doped regions 46, 48 which extend from the first side 26 toward N-buried layer 40. N-doped regions 46, 48 are adjacent to the Deep Trench Isolation structure 42, 44 and enclose first region 36.

A first N-doped region 50 and a second N-doped region 52 are arranged within first region 36 and which extend from the first side 26 toward N-buried layer 40. First N-doped region 50 and second N-doped region 52 subdivide first region 36 into a first p-epitaxial portion 54, a second p-epitaxial portion 56, and a third p-epitaxial portion 58. First, second, and third p-epitaxial portions 54, 56, 58 are non-overlapping with one another.

A first p-doped region 60 is arranged in first p-epitaxial portion 54, a second p-doped region 62 is arranged in second p-epitaxial portion 56, and a third p-doped region 64 is arranged in third p-epitaxial portion 58. Each of first p-doped region 60, second p-doped region 62, and third p-doped region 64 extends from first side 26 of p-doped substrate 24 into its corresponding p-epitaxial portion 54, 56, 58. It should be noted that p-doped regions 60, 62, 64 do not extend completely towards the N-buried layer 40. Further, p-doped regions 60, 62, 64 have a p-dopant concentration which is higher than the p-dopant concentration of the respective first, second, and third p-epitaxial portions 54, 56, 58.

A first P+ contact region 66 is arranged within first p-doped region 60. First P+ contact region 66 is connected to a first electrical connection 68 that is the reference voltage REF of ESD protection device 22, and is generally tied to a ground voltage. It is to be noted that first p-doped region 60 is not connected to first electrical connection 68 via an N doped contact region within first p-doped region 60. The p-dopant concentration of first P+ contact region 66, is higher than the p-dopant concentration of first p-doped region 60.

An N contact region 70, 72 and a P+ contact region 74, 76 are arranged in each of second p-doped region 62 and third p-doped region 64. N contact regions 70, 72 and P+ contact regions 74, 76 extend from first side 26 of p-doped substrate 24 into the respective P-doped regions 62, 64. However, N contact regions 70, 72 and P+ contact regions 74, 76 do not extend completely to the bottom of the respective second and third P-doped regions 62, 64. As seen in a direction from first side 26, N contact regions 70, 72 and P+ contact regions 74, 76 are surrounded by the respective second and third p-doped regions 62, 64. P+ contact regions 74, 76 have a p-dopant concentration which is higher than the p-dopant concentration of the P-doped regions 62, 64.

Thus, N contact region 70 and P+ contact region 74 are arranged within second p-doped region 62. A second electrical connection 78 is connected to both N contact region 70 and the P+ contact region 76. Second electrical connection 78 is configured to be connected to an input/output (I/O) device or pad 80 of an integrated circuit of semiconductor device 20. Likewise, N contact region 72 and P+ contact region 76 are arranged within third p-doped region 64. A third electrical connection 82 is connected to N contact region 72 and to P+ contact region 76. Third electrical connection 82 is configured to be connected to the reference voltage, REF, or to a ground voltage, GND.

It should be observed that first P+ contact region 66 is enclosed by a shallow trench isolation (STI) layer 84. Similarly, portions of second and third p-doped regions 62, 64 containing N contact regions 70, 72 and P+ contact regions 74, 76 are enclosed by shallow trench isolation layer 84. Shallow trench isolation is an integrated circuit feature which limits or prevents electric current leakage between adjacent semiconductor device components (e.g., between P+ contact region 66 and N/P+ contact regions 70, 74 and/or between N/P+ contact regions 70, 74 and N/P+ contact regions 72, 76). Thus, first P+ contact region 66 is at least partially surrounded by STI layer 84 formed at first side 26 of p-doped substrate 24.

Figure 2:
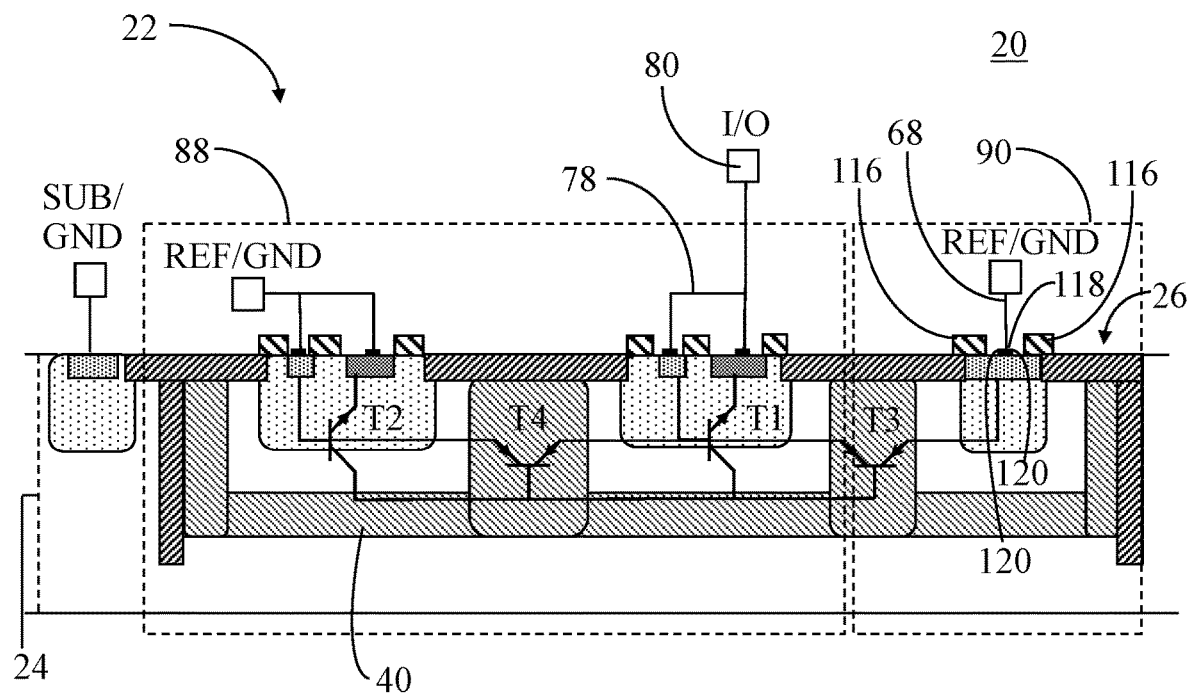
FIG. 2 shows transistors of the circuit of the ESD protection device in the cross-sectional view of FIG. 1.

Referring now to FIG. 2, FIG. 2 shows transistors T1, T2, T3, T4 of the circuit of ESD protection device 22 in the cross-sectional view of FIG. 1. The structure of ESD protection device 22 implements a specific electrical circuit. The shown transistors T1, T2, T3, T4 may be relevant for a situation in which a positively polarized ESD event is received (e.g., an ESD event of a positive voltage). In FIG. 2, it is assumed that I/O pad 80 of semiconductor device 20, and, thus, second electrical connection 78 received a fast rising high positive voltage (a positively polarized ESD event) with reference to GND. Transistors T1, T2 coupled with transistor T4 form a Silicon Controlled Rectifier (SCR) device to shunt part of the ESD current. Transistor T3 will couple with transistor T1 to form another SCR device to shunt a negative ESD current.

The structures that yield transistors T1 and T2 form a Silicon Controlled Rectifier (SCR) device delineated by a dashed line box 88, which is referred to hereinafter as SCR device 88 or first SCR device 88. The p-n-p junctions from first p-doped region 60 to first N-doped region 50 to second p-doped region 62 form a pnp transistor T3. The structures that form pnp transistor T3 are delineated by a dashed line box 90, which is referred to hereinafter as pnp transistor 90. The pnp transistor 90 is connected with a base to a gate of SCR device 88 via N-buried layer NBL 40 and first N-doped region 50. Collectively, SCR device 88 and pnp transistor 90 thus form ESD protection device 22 for the integrated circuit(s) contained on or in semiconductor device 20.

Figure 3:
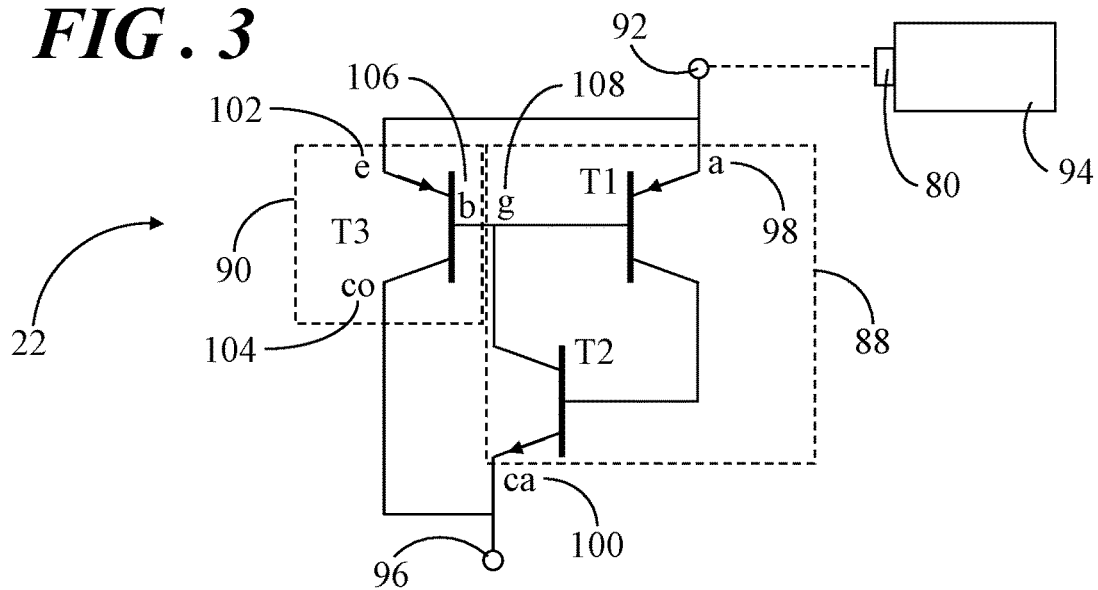
FIG. 3 shows a circuit diagram of the ESD protection device implemented in the semiconductor device of FIGS. 1 and 2.

FIG. 3 shows a circuit diagram of ESD protection device 22 implemented in semiconductor device 20 (FIGS. 1-2). As shown in FIG. 3, ESD protection device 22 comprises a first terminal 92 which is configured to be connected to I/O pad 80 of an integrated circuit 94 which is protected by the ESD protection device 22. Integrated circuit 94 is represented by a block for simplicity of illustration. Those skilled in the art will recognize that integrated circuit 94 can include a wide variety of electronic circuits formed at least in part from transistors formed in a semiconductor material that are designed to perform a particular function or functions. Integrated circuit 94 will not be further described herein for brevity.

ESD protection device 22 further comprises a second terminal 96 which is configured to be connected to a reference voltage or ground available on semiconductor device 20 (FIG. 2). Second terminal 96 is connected to the reference voltage or a ground voltage, assuming that semiconductor device is operating under a normal condition in which no ESD event is received. A pnp transistor T1 and a npn transistor T2 (discussed in connection with FIG. 2) form SCR device 88. An anode 98, "a" of SCR device 88 is coupled to first terminal 92 and a cathode 100 "ca" of the SCR device 88 is coupled to second terminal 96. ESD protection device 22 further includes a pnp transistor T3, referred to herein as pnp transistor 90. The pnp transistor 90 includes an emitter 102 "e" coupled to first terminal 92, a collector 104 "co" coupled to second terminal 96, and a base 106 "b" coupled to a gate 108 "g" of SCR device 88.

Figure 4:
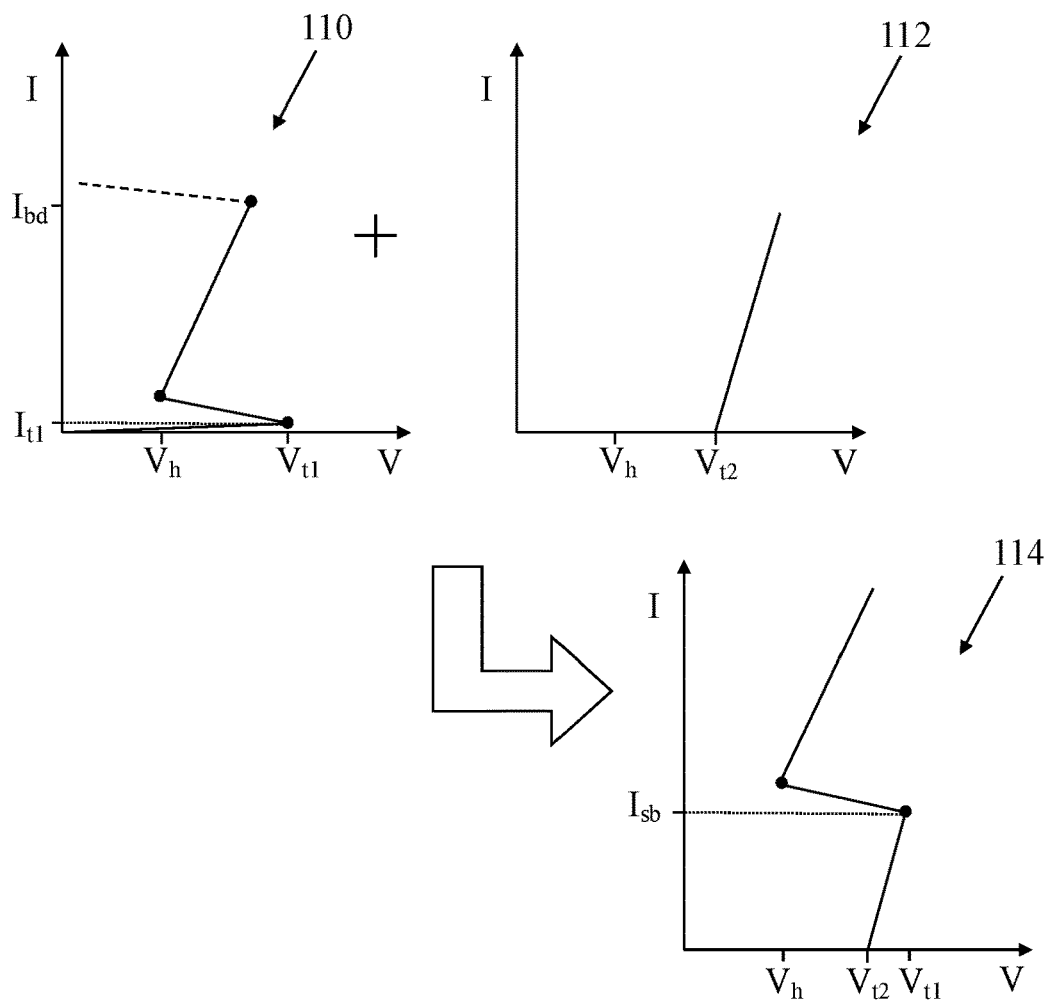
FIG. 4 shows the operational characteristics of the ESD protection device of FIGS. 1-3.

FIG. 4 shows the operational characteristics of ESD protection device 22 (FIGS. 1-3). SCR device 88 (FIG. 1) may have operational characteristics as presented in a first chart 110. If the voltage across SCR device 88 increases towards a first trigger voltage, $V_{t1}$, SCR device 88 begins to operate. When the first trigger voltage, $V_{t1}$, is reached the current value through ESD protection devices 22 is equal to the trigger current, $I_{t1}$. As soon as SCR device 88 begins its operation, the voltage across SCR device 88 reduces to a holding voltage, $V_h$, and from that point onwards, if the current through the SCR device 88 increases, the voltage across the SCR device 88 linearly increases as well. The first trigger voltage, $V_{t1}$, strongly depends on a distance between the second N-doped region 52 and third p-doped region 64 along a shortest line through the third epitaxial portion 58. Thus, the distance between the second N-doped region 52 and third p-doped region 64 may be configured to obtain a first predefined trigger voltage, $V_{t1}$.

The pnp transistor 90 may have operational characteristics as presented in a second chart 112. When the voltage across ESD protection device 22 increases, the n-p junction from the first N-doped region 50 toward the first p-doped region 60 is reverse biased. As soon as the breakdown voltage of this junction is reached at a second trigger voltage $V_{t2}$, an avalanche phenomenon by impact ionization is created through this n-p junction. A hole current flows through from first p-doped region 60. First p-doped region 60 is resistive and once the voltage difference between first N-doped region 50 (which is connected to ground) and first p-doped region 60 becomes larger than, for example, 0.3 volt, pnp transistor 90 begins to operate. As soon as pnp transistor 90 begins to operate, the current through pnp transistor 90 linearly increases with the voltage across pnp transistor 90. The second trigger voltage, $V_{t2}$, strongly depends on a distance between the first p-doped region 60 and first N-doped region 50 along a shortest line through first p-epitaxial portion 54. Thus, the distance between first p-doped region 60 and first N-doped region 50 is configured to obtain a second predefined trigger voltage $V_{t2}$.

SCR device 88 may be configured to have a first trigger voltage, $V_{t1}$, which is larger than the second trigger voltage, $V_{t2}$. Thus, the second trigger voltage, $V_{t2}$, is reached first when the voltage across ESD protection device 22 increases. Consequently, pnp transistor 90 is switched on first and initially conducts away a current of the ESD event towards the reference voltage pin REF. If, after the start of the operation of the pnp transistor 90, the voltage across ESD protection device 22 continues to increase, the first trigger voltage, $V_{t1}$, may be reached and SCR device 88 may also be switched on to conduct more current of the ESD event towards the reference voltage pin REF. This may result in snapback behavior. However, the snapback behavior may only be observed at a snapback current, $I_{sb}$, which can be much higher than the trigger current, $I_{t1}$, of SCR device 88. An example of the behavior of ESD protection device 22 that includes the combination of SCR device 88 and pnp transistor 90 is presented in a third chart 114.

The behaviors presented in charts provide an example behavior of ESD protection device 22 in semiconductor device 20 in response to an ESD event. Those skilled in the art will recognize that other ESD protection devices that include a combined architecture of an SCR device and PNP transistor may exhibit a different behavior in response to an ESD event than that shown.

With reference back to FIGS. 1 and 2, a trend toward system-on-chip (SoC) configurations, small outline package (SoP) configurations, and so forth with system level pins and integrated ESD protection (e.g., ESD protection device 22) calls for system level tests for supporting ESD and EMI compliance qualification of the systems. Some system level tests may be performed utilizing an ESD simulator, also known as an ESD gun, to test the immunity of devices (e.g., semiconductor device 20) to electrostatic discharge (also referred to as an ESD event). An automotive integrated circuit is typically placed on an application circuit board. For automotive integrated circuits, a global pin is a pin that communicates with/connects outside of the application board. Per automotive requirements, all global pins should pass ESK "gun-stress" tests. ESD testing is necessary for most suppliers of components for motor vehicles as part of required electromagnetic compatibility (EMI) testing. However, it can be challenging for an ESD protection device that includes a combined SCR device/pnp transistor architecture (e.g., ESD protection device 22) to pass such system level ESD testing.

In accordance with some embodiments, ESD protection device 22 is manufactured with enhanced robustness to ESD events and, commensurately, enhanced ability to pass system level ESD testing. To that end, ESD protection device 22 further includes a first insulation structure 116 formed on first P+ contact region 66 and on STI layer 84 at an intersection of first P+ contact region 66 and on STI layer 84. In some embodiments, a salicide structure 118 may be formed on first P+ contact region 66 such that first insulation structure 116 fully surrounds lateral edges 120 of salicide structure 118. Hence, salicide structure 118 is interposed between first P+ contact region 66 and first electrical connection 68 so as to be coupled to the reference voltage or to the ground voltage REF/GND. ESD protection device 22 may further include a second insulation structure 122 surrounding N contact region 70 and P+ contact region 74 of SCR device 88. Similarly, a third insulation structure 124 may surround N contact region 72 and P+ contact region 76 of SCR device 88. Salicide structures 126 may be formed on each of N contact regions 70, 72, and P+ contact regions 74, 76.

In the fabrication of integrated circuit devices, siliciding processes (also referred to as silicidation) are often used in order to obtain higher circuit performance. In a siliciding process, a refractory metal layer is deposited and then annealed. The underlying silicon reacts with the refractory metal layer to produce a silicide overlying the gate electrode and source and drain regions of a transistor. The silicided gate and source/drain regions have lower resistance than non-silicided regions, especially in smaller geometries, and hence, higher circuit performance. Since the metal layer is in direct contact with the silicon, the process is sometimes referred to as "self-aligned." Hence, the term "salicide" is sometimes utilized as a compaction of the phrase "self-aligned silicide" to refer to contact formation utilizing a self-aligned process.

Typically, a siliciding process may be performed on one part of a wafer while protecting another portion of the wafer from the siliciding process. For example, a resist protective oxide (RPO) layer may be deposited over the semiconductor device structures and then selectively removed where silicidation is desired. The RPO layer prevents silicidation where it remains over the semiconductor device structures.

Accordingly, salicide structures 118, 126 may be formed over respective P+ contact regions 66, 74, 76 and N contact regions 70, 72 utilizing this self-aligned siliciding process and insulation structures 116, 122, 124 may be formed from the resist protective oxide utilized during the siliciding process. In some embodiments, first insulation structure 116 may be discontinuous from second and third insulation structures 122, 124.

The presence of first insulation structure 116 (e.g., resist protective oxide) at the intersection of first P+ contact region 66 and STI layer 84 of pnp transistor 90 blocks salicide structure 118, which effectively increases the resistance at the edges of first P+ contact region. This can be referred to as a ballasting technique in which additional resistance is added. The additional resistance (e.g., $R_{BALLAST}$) can facilitate uniform current flow for ESD devices. Thus, current crowding at the edge or end of ESD devices can be avoided, thereby improving the robustness of ESD protection device 22 to ESD events. Further, the utilization of the RPO layer to form first insulation structure 116 enables the technique to be implemented in existing designs and processes without increasing the footprint of the ESD protection device.

Figure 5:
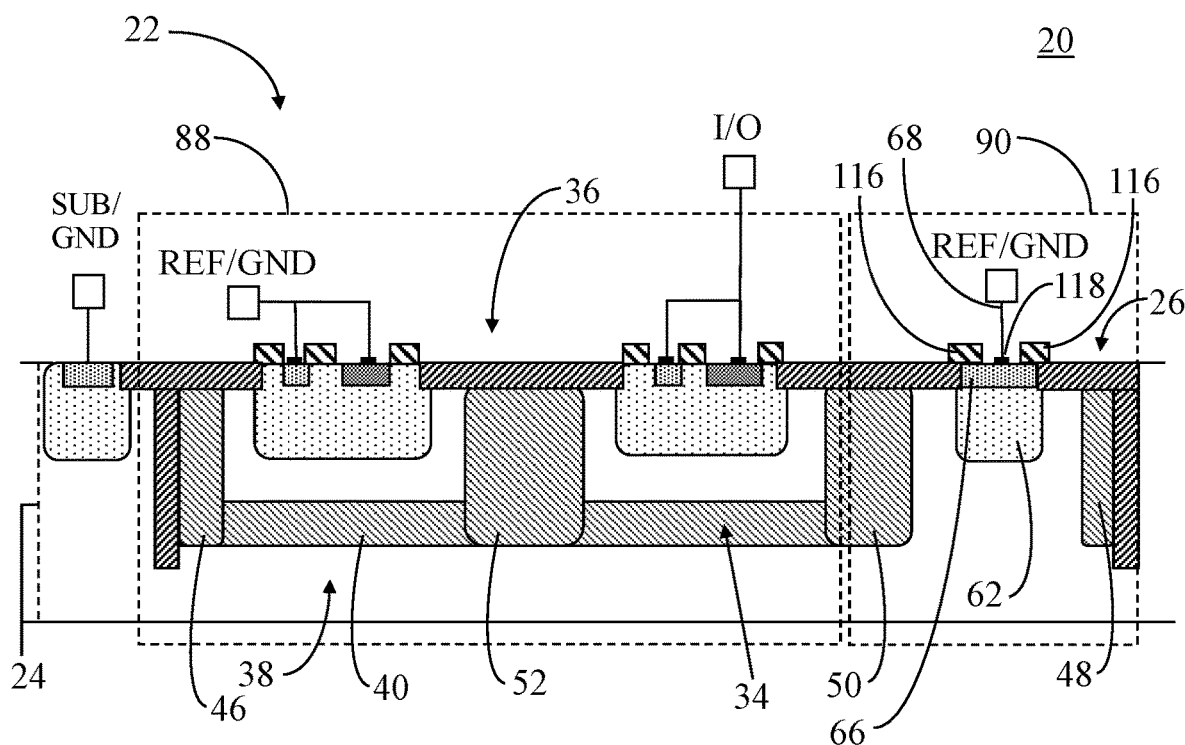
FIG. 5 shows in a cross-sectional view a structure of the semiconductor device of FIG. 1 in accordance with another embodiment.

Referring now to FIG. 5, FIG. 5 shows, in a cross-sectional view, a structure of semiconductor device 20 in accordance with another embodiment. Many of the structures and functions of semiconductor device 20 shown in FIG. 5 are the same as those presented in connection with FIGS. 1-2 above. Hence, the same reference numbers will be utilized herein. Thus, ESD protection circuit 22 includes first insulation structure 116 surrounding salicide structure 118 which is connected first electrical connection 68 to a reference voltage or to ground (REF/GND). The ESD robustness of semiconductor device 20 may be further improved in some embodiments by partially removing N-buried layer 40 at the bottom of pnp transistor 90.

As discussed in detail previously, isolation structure 34 includes N-buried layer 40 arranged in the lateral direction at the interface between first and second regions 36, 38 of p-doped substrate 24. In this example, isolation structure 34 additionally includes N-doped regions 46, 48 and first and second N-doped regions 50, 52 all of which extend from first side 26 toward N-buried layer 40. In accordance with the embodiment of FIG. 5, SCR device 88 is located in first region 36 such that N-buried layer 40 is present below SCR device 88 at the interface between first and second regions 36, 38. However, N-buried layer 40 is absent below pnp transistor 90. N-doped region 50 isolates first region 36 in which SCR device 88 is located.

In this configuration of semiconductor device 20, base 106 (FIG. 3) of pnp transistor 90 is coupled to gate 108 (FIG. 3) of SCR device 88 via N-doped region 50. Prior art configurations may have N-buried layer 40 below pnp transistor 90. In those prior art configurations, base 106 of pnp transistor 90 may be coupled to gate 108 of SCR device 88 via N-buried layer 40 plus N-doped region 50. The presence of N-doped region 50 below pnp transistor 90 may limit ESD performance of an ESD protection device. In the configuration of FIG. 5, enhanced robustness to ESD events may be achieved due to the presence of isolation structure 116. Additionally, the absence of N-buried layer 40 removes a vertical pnp configuration to thus further improve the ESD performance of ESD protection device 22.

Figure 6:
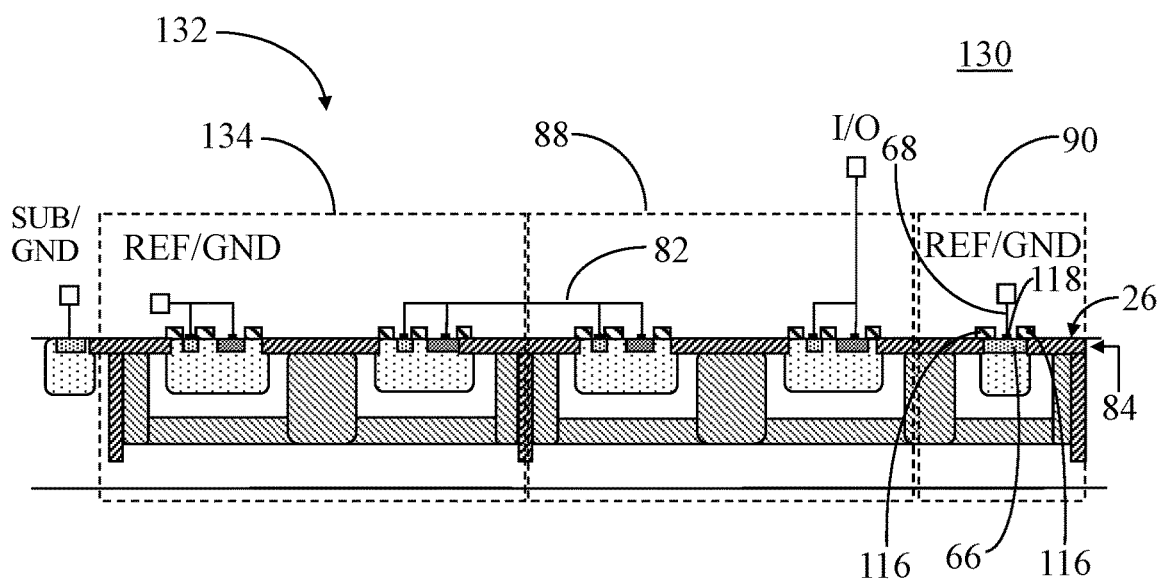
FIG. 6 shows, in a cross-sectional view, a structure of another semiconductor device in which an ESD protection device is implemented in accordance with another embodiment.

Referring now to FIG. 6 shows, in a cross-sectional view, a structure of another semiconductor device 130 in which an ESD protection device 132 is implemented in accordance with another embodiment. In FIG. 6, ESD protection device 132 includes pnp transistor 90 coupled in parallel to the first SCR device 88. Further description of the structures of first SCR device 88 and pnp transistor 90 common to both semiconductor device 20 (FIG. 1) and semiconductor device 130 is not repeated herein for brevity. In this configuration, third electrical connection 82 of first SCR device 88 is coupled in series to a second silicon controlled rectifier (SCR) device 134 which provides a coupling to the reference voltage or the ground voltage (REF/GND). The series arrangement of first and second SCR devices 88, 134 may provide a higher trigger voltage, $V_{t1}$, as compared to the single SCR device 88 configuration of semiconductor device 20 (FIG. 1).

Like ESD protection device 22 (FIG. 1), pnp transistor 90 of ESD protection device 134 includes insulation structure 116 surrounding salicide structure 118, which is connected via first electrical connection 68 to a reference voltage or to ground (REF/GND). The presence of first insulation structure 116 (e.g., resist protective oxide) at the intersection of first P+ contact region 66 and STI layer 84 of pnp transistor 90 blocks salicide structure 118, which effectively increases the resistance at the edges of first P+ contact region. This increased resistance improves the robustness of ESD protection device 132 to ESD events.

Figure 7:
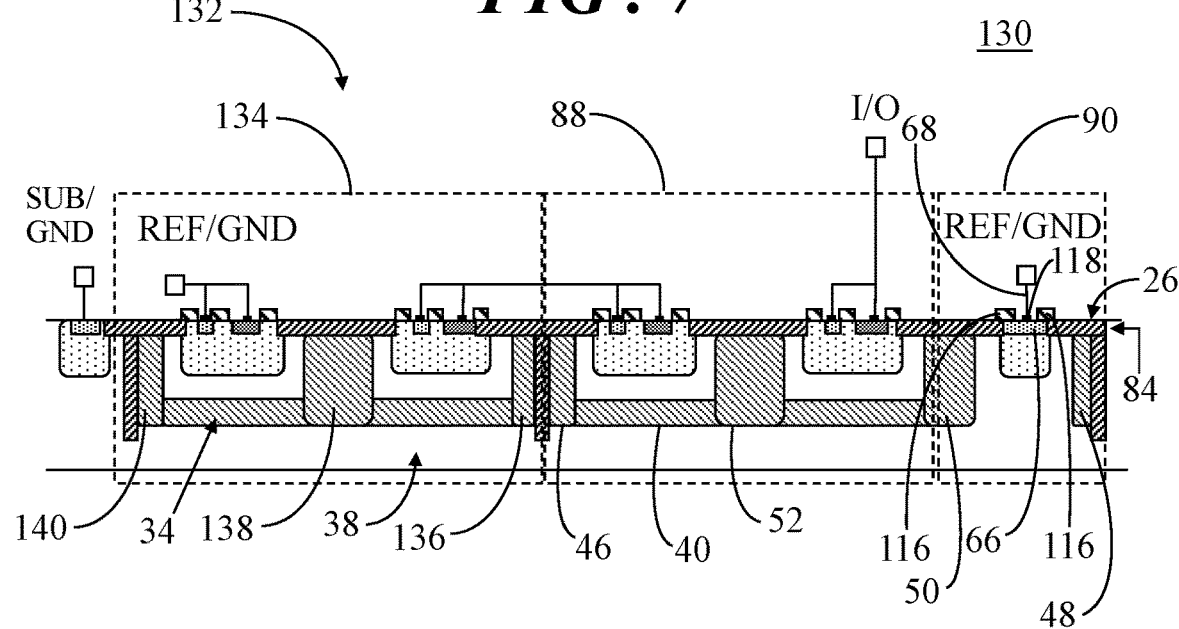
FIG. 7 shows in a cross-sectional view a structure of the semiconductor device of FIG. 6 in accordance with another embodiment.

FIG. 7 shows in a cross-sectional view a structure of semiconductor device 130 in accordance with another embodiment. Many of structures of semiconductor device 130 shown in FIG. 7 are the same as those presented in connection with FIG. 6. Hence, the same reference numbers will be utilized herein. Thus, ESD protection device 132 includes first insulation structure 116 surrounding salicide structure 118 which is connected via first electrical connection 68 to a reference voltage or to ground (REF/GND). Like the structures presented above, the ESD robustness of semiconductor device 130 may be further improved in some embodiments by partially removing N-buried layer 40 at the bottom of pnp transistor 90.

In the example embodiment of FIG. 7, isolation structure 34 includes N-buried layer 40 arranged in the lateral direction at the interface between first and second regions 36, 38 of p-doped substrate 24. In this example, isolation structure 34 additionally includes N-doped regions 46, 48, first and second N-doped regions 50, 52, and N-doped regions 136, 138, 140 associated with second SCR device 134 all of which extend from first side 26 toward N-buried layer 40. In accordance with the embodiment of FIG. 7, first and second SCR devices 88, 134 are located in first region 36 such that N-buried layer 40 is present below first and second SCR device 88, 134 at the interface between first and second regions 36, 38. However, N-buried layer 40 is absent below pnp transistor 90. N-doped region 50 isolates first region 36 in which first and second SCR devices 88, 134 is located from pnp transistor 90. In the configuration of FIG. 7, enhanced robustness to ESD events may be achieved due to the presence of isolation structure 116. Additionally, the absence of N-buried layer 40 removes the vertical pnp configuration to thus further improve the ESD performance of ESD protection device 132.

Figure 8:
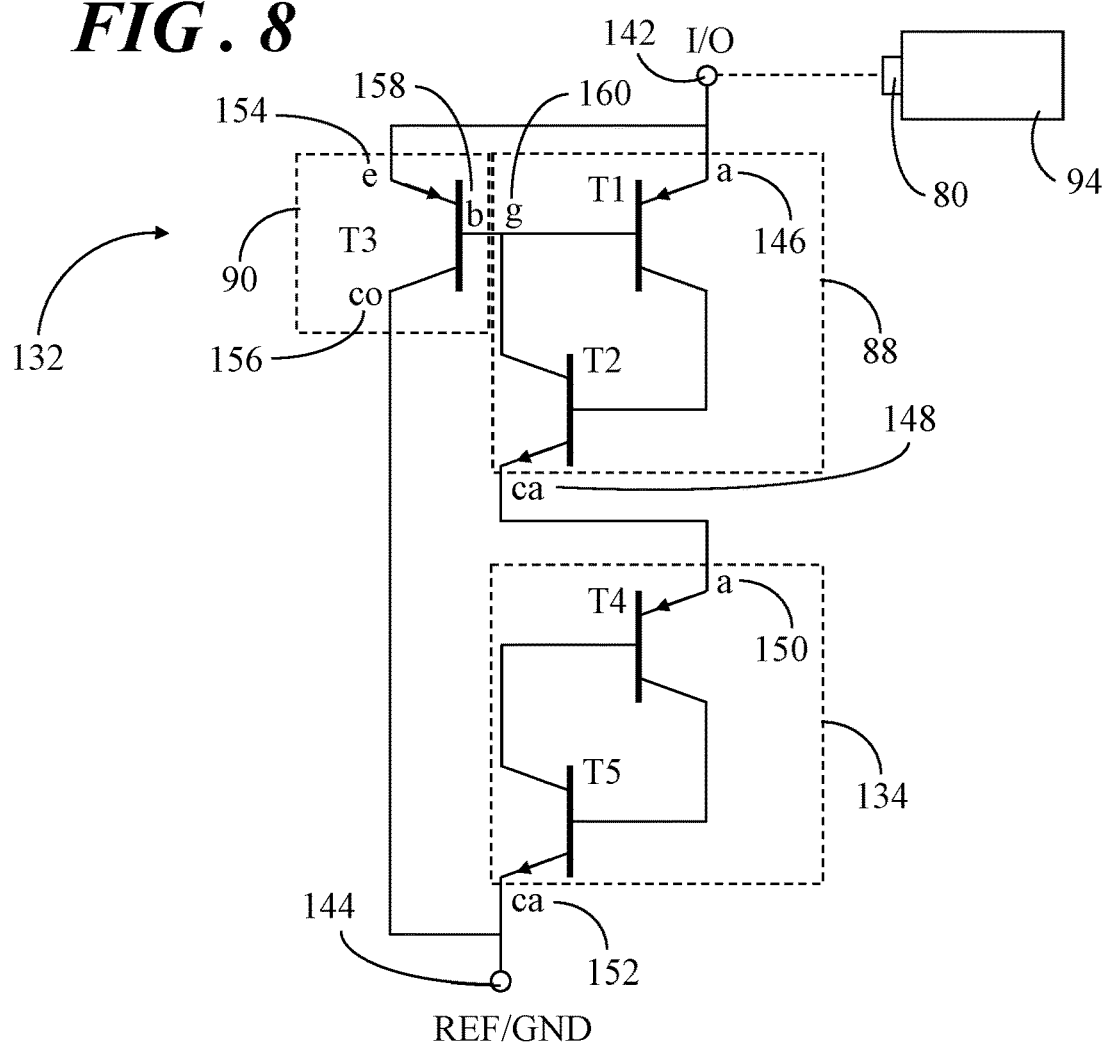
FIG. 8 shows a circuit diagram of the ESD protection device implemented in the semiconductor device of FIGS. 6 and 7.

FIG. 8 shows a circuit diagram of ESD protection device 132 implemented in semiconductor device 130 of FIGS. 6 and 7. As discussed above, ESD protection device 132 includes a series arrangement of first and second SCR devices 88, 134. This series arrangement of first and second SCR devices 88, 134 is arranged in parallel to pnp transistor 90. ESD protection device 132 includes an I/O terminal 142 configured to be coupled to an I/O device of the integrated circuit (e.g., I/O pad 80 of IC 94) implemented on semiconductor device 130 (FIG. 6). ESD protection device 132 further comprises a terminal 144 configured to be coupled to a reference voltage or a ground voltage (REF/GND). ESD protection device 132 includes first SCR device 88, second SCR device 134, and pnp transistor 88.

An anode 146 "a" of the first SCR device 88 is coupled to I/O terminal 142, a cathode 148 "ca" of first SCR device 88 is coupled to an anode 150 "a" of second SCR device 134. A cathode 152 "ca" of second SCR device 134 is coupled to terminal 144. An emitter 154 "e" of pnp transistor 90 is coupled to the I/O terminal 142, a collector 156 "co" of pnp transistor 90 is coupled to terminal 144, and a base 158 "b" of pnp transistor 90 is coupled to a gate 160 "g" of first SCR device 88. The operational behavior of ESD protection device 132 is similar to the operational behavior of previously discussed ESD protection device 22 (FIG. 1). However, the first trigger voltage, $V_{t1}$, of the series arrangement of first and second SCR devices 88, 134 may be higher than the trigger voltage, $V_t$, of the single SCR device configuration of FIG. 1.

The ESD protection device configurations of FIGS. 1-8 are provided to illustrate the features of an insulation structure at the edges of the P+ area on the negative pin of the pnp transistor of a combined SCR/pnp transistor architecture and the absence of the N-buried layer below the pnp transistor of a combined SCR/pnp transistor architecture in order to enhance the robustness of such an ESD protection device to an ESD event, and therefore protect associated integrated circuits from being damaged. Various other ESD protection device architectures that include a combined SCR/pnp transistor may be alternatively employed in which robustness of the ESD protection device is enhanced by forming an insulation structure at the edges of the P+ area on the negative pin of the pnp transistor and/or by removing the N-buried layer below the pnp transistor of the combined SCR/pnp transistor.

Figure 9:
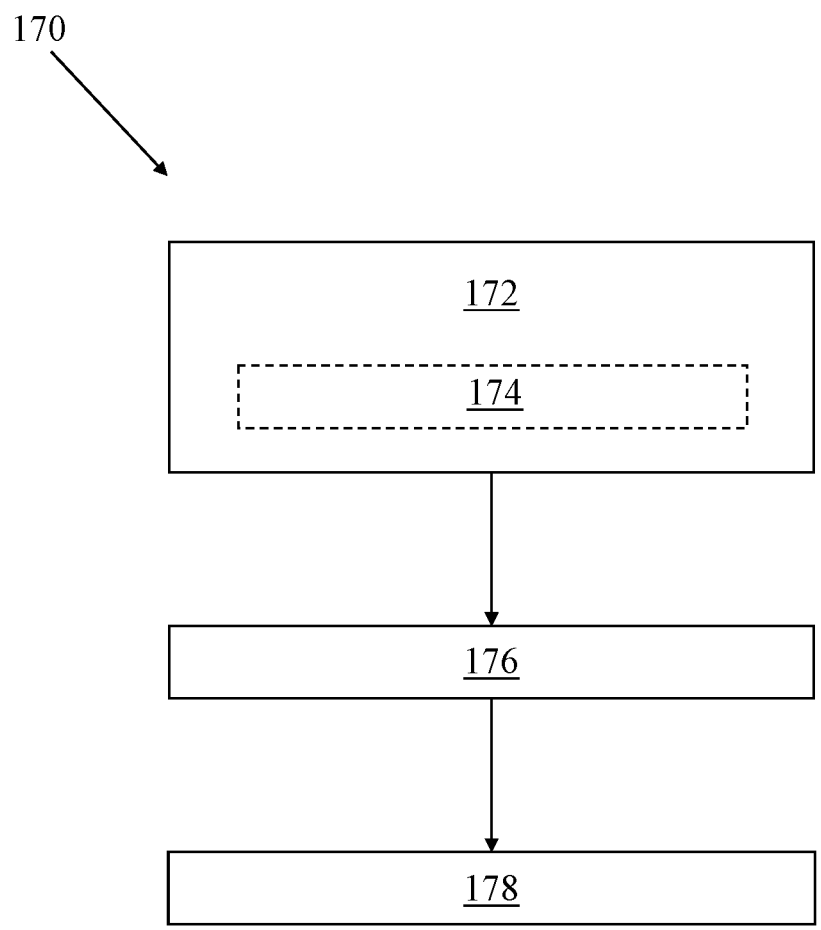
FIG. 9 shows a method of manufacturing a semiconductor device that includes an ESD protection device having enhanced robustness to ESD events.

FIG. 9 shows a method 170 of manufacturing a semiconductor device that includes an ESD protection device having enhanced robustness to ESD events. Method 170 will be discussed in connection with fabrication of semiconductor device 20 that includes ESD protection device 22. Hence, reference should be made concurrently to FIGS. 1 and 5 during the ensuing discussion of method 170. The following methodology applies equivalently to the configuration of FIG. 6, as well as alternative combined SCR/pnp transistor architectures.

At a block 172, a p-doped semiconductor substrate is obtained that includes an isolation structure (e.g., isolation structure 34) separating a first region and a second region (e.g., first and second regions 36, 38) of the p-doped substrate. The isolation structure includes an N-buried layer (e.g., N-buried layer 40) arranged in a lateral direction at an interface between the first and second regions of the p-doped substrate, in which the first region extends from the first side (e.g., first side 26) of the p-doped substrate toward the N-buried layer. At least one SCR device (e.g., SCR device 88) and a pnp resistor (e.g., pnp resistor 90) are formed in the first region. As discussed in detail above, the pnp transistor is coupled in parallel with the SCR device, and the pnp transistor includes a first contact region (e.g., first contact region 66 of pnp transistor 90) formed at the first side of the substrate, the first contact region being at least partially surrounded by a shallow trench isolation layer (e.g., STI layer 84) formed at the first side of the substrate.

In an optional embodiment denoted by a dashed line block 174 within stage 172, the N-buried layer may have been removed below the pnp transistor (see FIG. 5) during manufacture of the N-buried layer such that the N-buried layer is present below the SCR device at the interface between the first and second regions, but the N-buried layer is absent below the pnp transistor.

At a block 176, an insulation structure (e.g., first insulation structure 116) is formed on the first contact region and on the STI layer at an intersection of the first contact region and on the STI layer. An opening is formed in the insulation structure to expose that portion of the first contact region that is to undergo a silicidation process. Additional insulation structures (e.g., second and third insulation structures 122, 124) may be formed at the first side surrounding other regions of the SCR device that are to undergo the silicidation process. The insulation structures may be formed from a resist protective oxide (RPO) layer that is deposited over the semiconductor device structures and is selectively removed where silicidation is desired. The RPO insulation structure(s) prevents silicidation where it remains over the semiconductor device structures.

At a block 178, a refractory metal layer may be deposited and annealed at those areas on the semiconductor device that are exposed from the RPO insulation layer. The underlying silicon of the p-doped substrate reacts with the refractory metal layer to produce salicide structures (e.g., self-aligned silicide structures 118, 126) over the exposed regions (e.g., first P+ contact region 66, N contact regions 70, 72, P+ contact regions 74, 76). Thus, the RPO insulation layer fully surrounds the lateral edges (i.e., 120) of the salicide structure formed on the P+ contact region of the pnp transistor. Following block 178, additional operations of the manufacturing process may be performed. However, the above described methodology yields an ESD protection device that includes the RPO insulation layer surrounding the salicide structure formed on the P+ contact region of the pnp transistor and, optionally, removal of the N-buried layer below the pnp transistor which yields enhanced robustness of the ESD protection device to ESD events and thereby improved protection of the integrated circuit or circuits associated with the ESD protection device.

The semiconductor substrate described herein can be any semiconductor material or combinations of materials, such as gallium arsenide, silicon germanium, silicon-on-insulator (SOI), silicon, monocrystalline silicon, the like, and combinations of the above. As used herein, the term "semiconductor" is intended to include any semiconductor whether single crystal, poly-crystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline structures, amorphous structures, thin film structures, layered structures as, for example, and not intended to be limiting, semiconductor-on-insulation (SOI) structures, and combinations therefore. For convenience of explanation and not intended to be limiting, semiconductor devices and methods of fabrication are described herein for silicon semiconductors but persons skilled in the art will understand that other semiconductor materials may also be used. Additionally, various device types and/or doped semiconductor regions may be identified as being of N type or P type, but this is merely for convenience of description and not intended to be limiting, and such identification may be replaced by the more general description of being of a "first conductivity type" or a "second, opposite, conductivity type" where the first type may be either N or P type and the second type then is either P or N type.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Thus, it is to be understood that the architectures depicted herein are merely exemplary, and that many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality. It is further to be noted, when two components of an electronic circuit or of a semiconductor device are "coupled" to each other, there is at least an electrical conducting path between them. However, "coupling" does not mean that no other devices may be present between the two components and when two components are coupled to each other, other electronic components may be present on the electrical connection between the two components.

Embodiments described herein entail ESD protection devices, semiconductor devices that include ESD protection devices, and methodology for manufacturing a semiconductor device that includes an ESD protection device. An embodiment of an electrostatic discharge (ESD) protection device for protecting an integrated circuit against an ESD event received at the integrated circuit, the ESD protection device comprising a first terminal configured to be coupled to an input/output (I/O) pad of the integrated circuit, a second terminal configured to be coupled to a reference voltage or to a ground voltage, a silicon-controlled rectifier (SCR) having an anode connected to the first terminal and a cathode connected to the reference voltage or to the ground voltage, and a pnp transistor coupled in parallel with the SCR. The pnp transistor has an emitter coupled to the first terminal, a collector coupled to the second terminal, and a base coupled to a gate of the SCR, wherein the pnp transistor includes a first contact region formed at a first side of a substrate, the first contact region being at least partially surrounded by a shallow trench isolation (STI) layer formed at the first side of the substrate, and wherein an insulation structure is formed at an intersection of the first contact region and the STI layer.

In an example, the ESD protection device further comprises a salicide structure formed on the first contact region of the pnp transistor. The insulation structure fully surrounds lateral edges of the salicide structure.

In an example, the salicide structure is configured to be coupled to the reference voltage or to the ground voltage.

In an example, the substrate comprises a p-doped substrate having the first side. The ESD protection device further comprises an isolation structure formed in the p-doped substrate. The isolation structure separates a first region of the p-doped substrate from a second region of the p-doped substrate. The isolation structure comprises an N-buried layer arranged in a lateral direction at an interface between the first and second regions of the p-doped substrate. The first region extends from the first side toward the N-buried layer. The SCR is located in the first region such that the N-buried layer is present below the SCR at the interface between the first and second regions. The N-buried layer is absent below the pnp transistor.

In an example, the ESD protection device further comprises an N-doped region extending from the first side and contacting the N-buried layer. The N-doped region isolates the first region in which the SCR is located from the pnp transistor located outside of the first region.

In an example, the base of the pnp transistor is coupled to the gate of the SCR via the N-doped region.

In an example, the insulation structure comprises resist protective oxide (RPO).

In an example, the insulation structure is a first insulation structure. The SCR comprises at least a second contact region and a third contact region; a second insulation structure surrounds the second contact region; and a third insulation structure surrounds the third contact region. The first insulation structure is discontinuous from the first and second insulation structures.

In an example, the SCR is a first SCR. The ESD protection device further comprises a second SCR arranged between the first SCR and the second terminal. An anode of the second SCR is connected to a cathode of the first SCR. A cathode of the second SCR is connected to the second terminal.

In an example, wherein the substrate comprises a p-doped substrate having the first side. The ESD protection device further comprises an isolation structure formed in the p-doped substrate. The isolation structure separates a first region of the p-doped substrate from a second region of the p-doped substrate. The isolation structure comprises an N-buried layer arranged in a lateral direction at an interface between the first and second regions of the p-doped substrate. The first region extends from the first side toward the N-buried layer. The first SCR and the second SCR are located in the first region such that the N-buried layer is present below the first SCR and the second SCR at the interface between the first and second regions. The N-buried layer is absent below the pnp transistor.

An embodiment of an integrated circuit comprising at least one of the ESD protection device.

An embodiment of a semiconductor device comprises an integrated circuit and an electrostatic discharge (ESD) protection device for protecting the integrated circuit against an ESD event received at an input/output (I/O) pad of the integrated circuit, wherein the ESD protection device comprises a first terminal coupled to the I/O pad of the integrated circuit, a second terminal coupled to a reference voltage or to a ground voltage, a silicon-controlled rectifier (SCR) having an anode connected to the first terminal and a cathode connected to the reference voltage or the ground voltage, and a pnp transistor coupled in parallel with the SCR. The pnp transistor has an emitter coupled to the first terminal, a collector coupled to the second terminal, and a base coupled to a gate of the SCR, wherein the pnp transistor includes a first contact region formed at a first side of a substrate, the first contact region being at least partially surrounded by a shallow trench isolation (STI) layer formed at the first side of the substrate, and wherein a resist protective oxide (RPO) insulation structure is formed at an intersection of the first contact region and the STI layer.

In an example, wherein the ESD protection device further comprises a salicide structure formed on the first contact region of the pnp transistor. The RPO insulation structure fully surrounds lateral edges of the salicide structure.

In an example, the substrate comprises a p-doped substrate having the first side. The ESD protection device further comprises an isolation structure formed in the p-doped substrate. The isolation structure separating a first region of the p-doped substrate from a second region of the p-doped substrate. The isolation structure comprises an N-buried layer arranged in a lateral direction at an interface between the first and second regions of the p-doped substrate. The first region extends from the first side toward the N-buried layer. The SCR is located in the first region such that the N-buried layer is present below the SCR at the interface between the first and second regions. The N-buried layer is absent below the pnp transistor.

In an example, the ESD protection device further comprises an N-doped region extending from the first side and contacting the N-buried layer. The N-doped region isolates the first region in which the SCR is located from the pnp transistor. The base of the pnp transistor is coupled to the gate of the SCR via the N-doped region.

In an example, the SCR is a first SCR, and the ESD protection device further comprises a second SCR arranged between the first SCR and the second terminal. An anode of the second SCR is connected to the cathode of the first SCR. A cathode of the second SCR is connected to the second terminal.

In an example, the substrate comprises a p-doped substrate having the first side. The ESD protection device further comprises an isolation structure formed in the p-doped substrate. The isolation structure separating a first region of the p-doped substrate from a second region of the p-doped substrate. The isolation structure comprises an N-buried layer arranged in a lateral direction at an interface between the first and second regions of the p-doped substrate. The first region extends from the first side toward the N-buried layer. The first SCR and the second SCR are located in the first region such that the N-buried layer is present below the first SCR and the second SCR at the interface between the first and second regions. The N-buried layer is absent below the pnp transistor.

An embodiment of a method of manufacturing a semiconductor device that includes an ESD protection device, the method comprising obtaining a substrate having a silicon-controlled rectifier (SCR) and a pnp transistor formed therein, the pnp transistor being coupled in parallel with the SCR, wherein the pnp transistor includes a first contact region formed at a first side of a substrate, the first contact region being at least partially surrounded by a shallow trench isolation (STI) layer formed at the first side of the substrate, and forming an insulation structure at an intersection of the first contact region and the STI layer.

In an example, the method further comprises forming a salicide structure on the first contact region of the pnp transistor; and the forming the insulation structure comprises fully surrounding lateral edges of the salicide structure with the insulation structure. The insulation structure comprises resist protective oxide (RPO).

In an example, the obtaining the substrate comprises obtaining a p-doped substrate and forming an isolation structure in the p-doped substrate. The isolation structure separates a first region of the p-doped substrate from a second region of the p-doped substrate. The isolation structure comprises an N-buried layer arranged in a lateral direction at an interface between the first and second regions of the p-doped substrate. The first region extends from the first side of the p-doped substrate toward the N-buried layer. The SCR is located in the first region such that the N-buried layer is present below the SCR at the interface between the first and second regions. The N-buried layer is absent below the pnp transistor.

Thus, ESD protection devices are implemented as a pnp transistor combined with one or more bi-directional silicon-controlled rectifiers (SCRs). The pnp transistor is manufactured to include a suitably located insulation structure (e.g., resist protective oxide) that can improve the robustness of the ESD protection circuit to an ESD event in some embodiments. In some embodiments, the combined SCR/pnp transistor configuration is further formed such that an N-buried layer is located below the one or more SCRs, but the N-buried layer is absent below the pnp transistor to further improve the robustness of the ESD protection circuit to an ESD event. The pnp transistor may be incorporated in prior art combined SCR/pnp transistor designs without requiring process changes and without increasing the footprint of the ESD circuit over prior art combined SCR/pnp transistor designs.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

The invention claimed is:

1. An electrostatic discharge, ESD, protection device for protecting an integrated circuit against an ESD event received at an integrated circuit, the ESD protection device comprising:
    a first terminal configured to be coupled to an input/output, I/O, pad of the integrated circuit;
    a second terminal configured to be coupled to a reference voltage or to a ground voltage;
    a silicon-controlled rectifier, SCR, having an anode connected to the first terminal and a cathode connected to the reference voltage or to the ground voltage;
    a pnp transistor coupled in parallel with the SCR, the pnp transistor having an emitter coupled to the first terminal, a collector coupled to the second terminal, and a base coupled to a gate of the SCR, wherein the pnp transistor includes a first contact region formed at a first side of a substrate, the first contact region being at least partially surrounded by a shallow trench isolation, STI, layer formed at the first side of the substrate, and wherein an insulation structure is formed at an intersection of the first contact region and the STI layer; and
    a salicide structure formed on the first contact region of the pnp transistor, wherein the insulation structure fully surrounds lateral edges of the salicide structure.

2. The ESD protection device of claim 1, wherein the salicide structure is configured to be coupled to the reference voltage or to the ground voltage.

3. The ESD protection device of claim 1, wherein the substrate comprises a p-doped substrate having the first side, and the ESD protection device further comprises an isolation structure formed in the p-doped substrate, the isolation structure separating a first region of the p-doped substrate from a second region of the p-doped substrate, the isolation structure comprising an N-buried layer arranged in a lateral direction at an interface between the first and second regions of the p-doped substrate, the first region extending from the first side toward the N-buried layer, wherein the SCR is located in the first region such that the N-buried layer is present below the SCR at the interface between the first and second regions, and the N-buried layer is absent below the pnp transistor.

4. The ESD protection device of claim 3 further comprising an N-doped region extending from the first side and contacting the N-buried layer, the N-doped region isolating the first region in which the SCR is located from the pnp transistor located outside of the first region.

5. The ESD protection device of claim 4, wherein the base of the pnp transistor is coupled to the gate of the SCR via the N-doped region.

6. The ESD protection device of claim 1, wherein the insulation structure comprises resist protective oxide, RPO.

7. The ESD protection device of claim 1, wherein:
    the insulation structure is a first insulation structure;
    the SCR comprises at least a second contact region and a third contact region;
    a second insulation structure surrounds the second contact region; and
    a third insulation structure surrounds the third contact region, wherein the first insulation structure is discontinuous from the first and second insulation structures.

8. The ESD protection device of claim 1, wherein the SCR is a first SCR, and the ESD protection device further comprises a second SCR arranged between the first SCR and the second terminal, an anode of the second SCR being connected to a cathode of the first SCR, and a cathode of the second SCR being connected to the second terminal.

9. The ESD protection device of claim 8, wherein the substrate comprises a p-doped substrate having the first side, and the ESD protection device further comprises an isolation structure formed in the p-doped substrate, the isolation structure separating a first region of the p-doped substrate from a second region of the p-doped substrate, the isolation structure comprising an N-buried layer arranged in a lateral direction at an interface between the first and second regions of the p-doped substrate, the first region extending from the first side toward the N-buried layer, wherein the first SCR and the second SCR are located in the first region such that the N-buried layer is present below the first SCR and the second SCR at the interface between the first and second regions, and the N-buried layer is absent below the pnp transistor.

10. A method of manufacturing a semiconductor device that includes an ESD protection device, the method comprising:
    obtaining a substrate having a silicon-controlled rectifier, SCR, and a pnp transistor formed therein, the pnp transistor being coupled in parallel with the SCR, wherein the pnp transistor includes a first contact region formed at a first side of the substrate, the first contact region being at least partially surrounded by a shallow trench isolation, STI, layer formed at the first side of the substrate;
    forming an insulation structure at an intersection of the first contact region and the STI layer; and
    forming a salicide structure on the first contact region of the pnp transistor; and
    the forming the insulation structure comprises fully surrounding lateral edges of the salicide structure with the insulation structure.

11. The method of claim 10, further comprising:
    wherein the insulation structure comprises resist protective oxide, RPO.

12. The method of claim 10, wherein the obtaining the substrate comprises:
    obtaining a p-doped substrate; and forming an isolation structure in the p-doped substrate, the isolation structure separating a first region of the p-doped substrate from a second region of the p-doped substrate, the isolation structure comprising an N-buried layer arranged in a lateral direction at an interface between the first and second regions of the p-doped substrate, the first region extending from the first side of the p-doped substrate toward the N-buried layer, wherein the SCR is located in the first region such that the N-buried layer is present below the SCR at the interface between the first and second regions, and the N-buried layer is absent below the pnp transistor.

13. A semiconductor device comprising:
an integrated circuit; and
an electrostatic discharge, ESD, protection device for protecting the integrated circuit against an ESD event received at an input/output, I/O, pad of the integrated circuit, the ESD protection device comprising:
   a first terminal configured to be coupled to an input/output, I/O, pad of the integrated circuit;
   a second terminal configured to be coupled to a reference voltage or to a ground voltage;
   a silicon-controlled rectifier, SCR, having an anode connected to the first terminal and a cathode connected to the reference voltage or to the ground voltage; and
   a pnp transistor coupled in parallel with the SCR, the pnp transistor having an emitter coupled to the first terminal, a collector coupled to the second terminal, and a base coupled to a gate of the SCR, wherein the pnp transistor includes a first contact region formed at a first side of a substrate, the first contact region being at least partially surrounded by a shallow trench isolation, STI, layer formed at the first side of the substrate, and wherein an insulation structure is formed at an intersection of the first contact region and the STI layer;
   a salicide structure formed on the first contact region of the pnp transistor, wherein the insulation structure fully surrounds lateral edges of the salicide structure.

14. The semiconductor device of claim 13, wherein the substrate comprises a p-doped substrate having the first side, and the ESD protection device further comprises an isolation structure formed in the p-doped substrate, the isolation structure separating a first region of the p-doped substrate from a second region of the p-doped substrate, the isolation structure comprising an N-buried layer arranged in a lateral direction at an interface between the first and second regions of the p-doped substrate, the first region extending from the first side toward the N-buried layer, wherein the SCR is located in the first region such that the N-buried layer is present below the SCR at the interface between the first and second regions, and the N-buried layer is absent below the pnp transistor.

15. The semiconductor device of claim 13, wherein:
the insulation structure is a first insulation structure;
the SCR comprises at least a second contact region and a third contact region;
a second insulation structure surrounds the second contact region; and
a third insulation structure surrounds the third contact region, wherein the first insulation structure is discontinuous from the first and second insulation structures.

16. The semiconductor device of claim 13, wherein the SCR is a first SCR, and the ESD protection device further comprises a second SCR arranged between the first SCR and the second terminal, an anode of the second SCR being connected to a cathode of the first SCR, and a cathode of the second SCR being connected to the second terminal.

17. The semiconductor device of claim 16, wherein the substrate comprises a p-doped substrate having the first side, and the ESD protection device further comprises an isolation structure formed in the p-doped substrate, the isolation structure separating a first region of the p-doped substrate from a second region of the p-doped substrate, the isolation structure comprising an N-buried layer arranged in a lateral direction at an interface between the first and second regions of the p-doped substrate, the first region extending from the first side toward the N-buried layer, wherein the first SCR and the second SCR are located in the first region such that the N-buried layer is present below the first SCR and the second SCR at the interface between the first and second regions, and the N-buried layer is absent below the pnp transistor.

* * * * *